(12) United States Patent
Ferrant et al.

(10) Patent No.: US 7,817,466 B2
(45) Date of Patent: Oct. 19, 2010

(54) SEMICONDUCTOR ARRAY INCLUDING A MATRIX OF CELLS AND A METHOD OF MAKING A SEMICONDUCTOR ARRAY HAVING A MATRIX OF CELLS

(75) Inventors: Richard Ferrant, Esquibien (FR); Franck Genevaux, Revel (FR); David Burnett, Meylan (FR); Gerald Gouya, Landaul (FR); Pierre Malinge, La Tessoualle (FR)

(73) Assignees: STMicroelectronics (Crolles 2) SAS, Crolles Cedex (FR); Freescale Semiconductor, Inc., Austin, TX (US)

( * ) Notice: Subject to any disclaimer, the term of this patent is extended or adjusted under 35 U.S.C. 154(b) by 90 days.

(21) Appl. No.: 12/130,918

(22) Filed: May 30, 2008

(65) Prior Publication Data
US 2009/0086535 A1    Apr. 2, 2009

(30) Foreign Application Priority Data
Jun. 4, 2007    (EP) ................... 07301083

(51) Int. Cl.
*G11C 11/34* (2006.01)
(52) U.S. Cl. .............. 365/174; 365/173; 365/189.08; 365/230.03
(58) Field of Classification Search .............. 365/174, 365/176, 189.08, 230.03
See application file for complete search history.

(56) References Cited

U.S. PATENT DOCUMENTS 5,821,592 A    10/1998  Hoenigschmid et al.
5,825,688 A    10/1998  Ueki
6,226,218 B1   5/2001   Kim
2004/0190350 A1  9/2004  Wada
2005/0104232 A1  5/2005  Shih
2005/0174873 A1  8/2005  Ferrant et al.
2005/0280001 A1  12/2005  Chang (Continued)

FOREIGN PATENT DOCUMENTS

EP    1 772 872 A1    4/2007

(Continued)

OTHER PUBLICATIONS

Fazan et al., "A Simple 1-Transistor Capacitor-Less Memory Cell for High Performance Embedded DRAMs," Proceedings of the IEEE 2002 Custom Integrated Circuits Conference, pp. 99-102, 2002.

(Continued)

*Primary Examiner*—Connie C Yoha
(74) *Attorney, Agent, or Firm*—Lisa K. Jorgenson; Timothy L. Boller; Seed IP Law Group PLLC

(57) ABSTRACT

A semiconductor array includes a matrix of cells, the matrix being arranged in rows and columns of cells, and a plurality of control lines. Each cell is coupled to a number of control lines allowing to select and read/write said cell. At least one of said control lines is coupled to cells of a plurality of columns and of at least two rows of the matrix.

25 Claims, 3 Drawing Sheets

U.S. PATENT DOCUMENTS

2007/0058427 A1* 3/2007 Okhonin et al. ............. 365/177
2007/0279959 A1* 12/2007 Wang et al. .................... 365/63
2009/0180321 A1* 7/2009 Torii ..................... 365/185.05

FOREIGN PATENT DOCUMENTS

| WO | 02/103703 A2 | 12/2002 |
| WO | 2004/102576 A2 | 11/2004 |
| WO | 2006/066890 A1 | 6/2006 |

OTHER PUBLICATIONS

Hamamoto et al., "A Floating Body Cell (FBC) fully Compatible with 90nm CMOS Technology Node for Embedded Applications," Proceedings of the 2006 IEEE International Conference on Integrated Circuit Design and Technology, Aug. 14, 2006, 6 pages.

* cited by examiner

SEMICONDUCTOR ARRAY INCLUDING A MATRIX OF CELLS AND A METHOD OF MAKING A SEMICONDUCTOR ARRAY HAVING A MATRIX OF CELLS

TECHNICAL FIELD

The present disclosure generally relates to semiconductor arrays.

Although the present description focuses mainly on floating body memory arrays, the possible fields of application of the embodiments are manifold. For example, embodiments may also include CMOS memory arrays, or even programmable logic arrays such as PLAs.

BACKGROUND INFORMATION

A memory array comprises a plurality of memory cells, or cells, and is organized into rows and columns of such cells. A column extends over the matrix in a vertical direction, whereas a row extends over the matrix in a horizontal direction. The cell that lies at the ith row and the jth column is called the i,j cell. The cells of a same column have a same j index, the i index varying from 1 to the number of rows of the matrix. The cells of a same row have a same i index, the j index varying from 1 to the number of columns of the matrix.

Each cell may comprise one or more storing elements, e.g., transistor(s) and/or capacitor(s). Each cell may be coupled to a number of control lines, e.g., one source line, one word line and one bit line. The control lines are conductive, e.g., metallic lines, which are typically coupled to one or more transistor(s) of the cell, via their source, gate or drain terminals for example.

Addressable bit lines may be coupled to the cells in a corresponding column of cells, and the cells in any row of cells may be coupled to a corresponding pair of addressable word and source lines. The control lines hence allow selecting any cell of the array and reading from or writing to the selected cell.

The words may typically comprise 8, 16, 32, 64, 128 or 256 bits, i.e., each word line is coupled to 8, 16, 32, 64, 128 or 256 cells respectively. As the number of cells in a row increases, the electrons in the word line or in the source line have to move over an increasingly long path. Furthermore, the dimensions of the semiconductor array tend to shrink, i.e., the section of the control line crossed by the electrons becomes smaller and smaller. The cells may therefore be relatively difficult to control in read and/or write mode.

BRIEF SUMMARY

One embodiment improves the electrical control of the cells.

In a first aspect, one embodiment provides a semiconductor array comprising a matrix of cells, and a plurality of control lines, each cell being coupled to a number of control lines allowing to select and to read data from or write data into the cell. The matrix is arranged in rows and columns of cells. At least one of the control lines is coupled to cells of a plurality of columns and of at least two rows of the matrix.

In such a block arrangement, this control line may be arranged so as to facilitate the moving of the electrons, thus allowing better electrical control of the coupled cells.

Typically, the number of control lines to which each cell is coupled comprises at least one selection line adapted to select the cell, and at least one access line adapted to read/write data from/into the cell.

The semiconductor array may for example comprise a memory array, or a logic array, e.g., programmable logic array (PLA), programmable array logic (PAL), field programmable gate array (FPGA), erasable programmable logic device (EPLD), etc.

The memory array may for example comprise a 1T DRAM, a 1T/1C DRAM or a 6T SRAM, the letters T and C referring to the number of transistors and capacitors, respectively, in one memory cell. The memory array may also comprise a flash memory, each cell of which comprising a transistor having a double gate. The memory array may also comprise a charge memory, each cell of which comprising a transistor and a variable resistor.

The semiconductor array may be realized using any technology, e.g., complementary metaloxide-semiconductor (CMOS) technology, silicon on insulator (SOI) technology, Silicon on Nothing (SON) technology, a FinFET technology, etc.

Some technologies, e.g., SOI and SON technologies, allow insulating components of the cells, such as transistors, thus allowing avoiding insulation regions, e.g., shallow trench isolation (STI) regions. For example, the body of a SOI transistor, i.e., the region between a source region and a drain region, is electrically floating, and no specific insulation region is needed to achieve insulation. Such floating body cells allow higher densities and smaller areas.

With one of the present embodiments, at least one of the control lines is coupled to cells of a plurality of columns and of at least two rows of the matrix. At least one cell of the at least two rows shares one of its terminals with a distinct cell in the another one of the at least two rows and in the same column, thus allowing to save silicon area.

By "sharing a terminal", it is not only meant that the terminals of the two cells are electrically coupled, but also that a single trace without insulating region is used for the shared terminal in the layout of the array.

Alternatively, no cell in the at least two rows shares one of its terminals with a distinct cell in the another one of these two rows and in the same column. That is, for each cell in these two rows, an insulating region is provided between this cell and any adjacent cell.

In prior art memory arrays, source terminals are shared between two cells within a same column. The cells sharing a same source terminal are coupled to a same bit line coupled to their drain terminals, and to distinct word lines. The gate terminal of each cell is coupled to a corresponding word line. In a prior art floating body memory array, addressing a determined cell may cause possible disturbs on the adjacent cell that shares its source terminal with the addressed cell. For example, when 2V is applied to the drain terminal of the addressed cell, the voltage at the body of the adjacent cell may rise up to substantially 0.6V if the gate and source terminals of the unselected cell are at 0V, as desired for operating with minimum power and high speed.

Typically, each writing or reading may cause a few percents modification to the voltage stored in the cell adjacent to the cell which is read or written. After a number of reading/writing cycles, the values stored in the adjacent cell may turn out to be irrelevant.

Two distinct selection lines are respectively coupled to the at least one cell and to the distinct cell that share a same terminal, i.e., there is a selection line that is not coupled to both cells. In the prior art, two cells sharing a source terminal have all their selection lines, e.g., source line and bit line, in common. When a word of a number of cells, e.g., 32 cells, is to be read/written, 32 bit lines are set so as to select the 32 cells. For each cell that is read or written, the adjacent cell that is disturbed is coupled to a same bit line and to a same source line. The disturbed cells hence do not belong to the group (word) of cells which is read or written.

If there is a selection line that is not coupled to both cells, it may be possible to read/write data from/into a number of cells without disturbing the cells of others words. Indeed, the adjacent cells that are disturbed may belong to the word that is being read/written, i.e., the consequences of a possible disturbing are very low.

In a further aspect, one embodiment provides a method for manufacturing a semiconductor array comprising a matrix of cells, the method comprising providing a plurality of control lines such that each cell is coupled to a number of control lines allowing to select and read/write said cell and such that at least one of said control lines is coupled to cells of a plurality of columns and of at least two rows of the matrix.

These and other aspects will be apparent from and elucidated with reference to the embodiments described hereinafter.

BRIEF DESCRIPTION OF THE SEVERAL VIEWS OF THE DRAWINGS

In all the figures, the same references denote similar or substantially similar elements.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
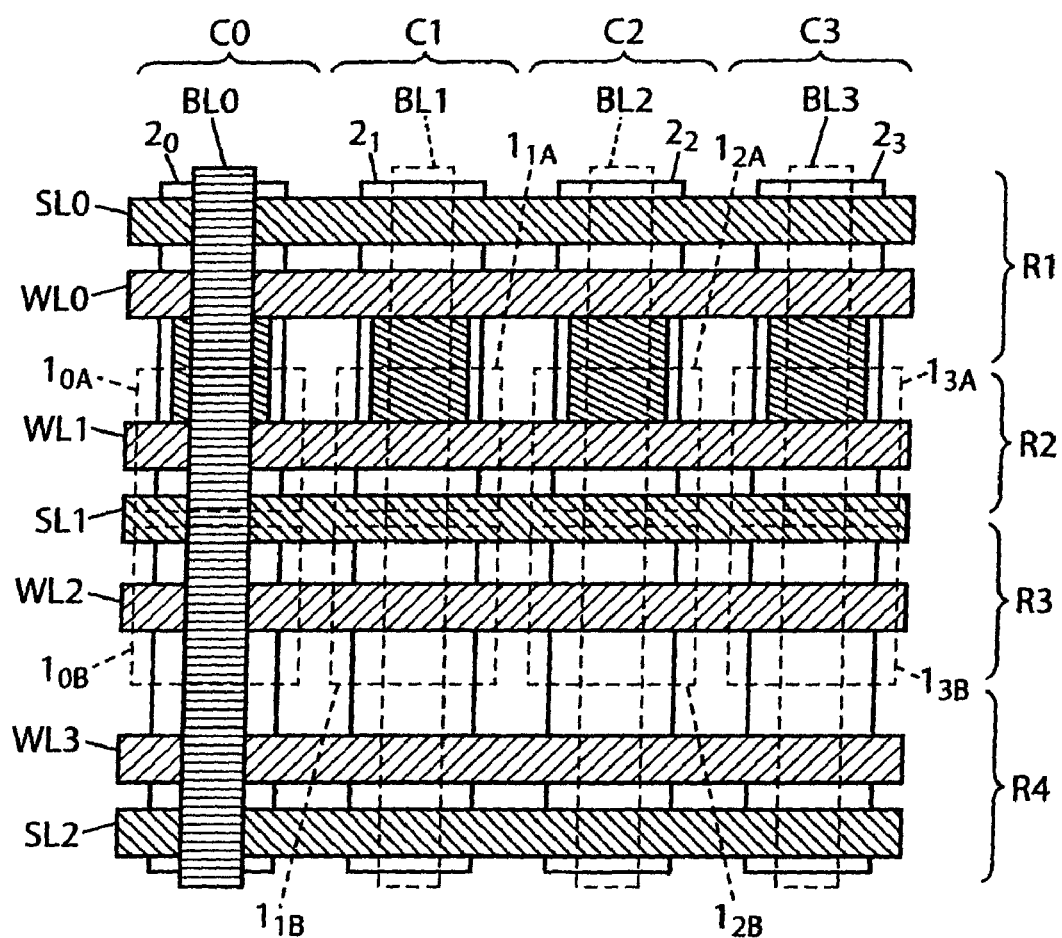
FIG. 1 shows a layout of an example of a portion of a semiconductor array according to Prior Art.

As shown in FIG. 1, a semiconductor array according to Prior Art comprises cells $1_{0A}$, $1_{0B}$, $1_{1A}$, $1_{1B}$, $1_{2A}$, $1_{2B}$, $1_{3A}$, $1_{3B}$. Each cell is coupled to a number of control lines. For example, the cell $1_{0A}$ is coupled to a word line WL1, a source line SL1 and to a bit line BL0.

Bit lines BL0, B1, BL2, BL3 extend over corresponding columns C0, C1, C2, C3, whereas word lines WL0, WL1, WL2, WL3 and source lines SL0, SL1, SL2 extend over corresponding rows R1, R2, R3, R4. Active areas $2_0$, $2_1$, $2_2$, $2_3$ extend over corresponding columns C0, C1, C2, C3.

Each cell shares its source terminal with another cell in the same column. For example, the cells $1_{0A}$ and $1_{0B}$ share a same source terminal, i.e., a single trace (not represented) is provided for the shared source terminal. The cells $1_{0A}$ and $1_{0B}$ are subsequently coupled to a same source line SL1. The cells $1_{0A}$ and $1_{0B}$ are thus coupled to a same source line SL1 and a same bit line BL0.

Source lines SL0, SL1, SL2 and bit lines BL0, BL1, BL2, BL3 are selection lines that allow selecting a cell, whereas word lines WL0, WL1, WL2, WL3 are access lines that allow reading/writing the content of a selected cell.

The cells are written or read word by word, each word being four cells long in this example. When the word comprising the cells $1_{0A}$, $1_{1A}$, $1_{2A}$, $1_{3A}$, is read, the source line SL1 is set, the bit lines BL0, BL1, BL2, BL3 are set one after the other, and the value of the word line WL1 changes according to the voltage at the cell of the word corresponding to the currently set bit line. If this word is written, the word line WL1 takes the desired value for each cell selected by the currently set bit line.

During such read/write operations, the voltages stored at adjacent cells $1_{0B}$, $1_{1B}$, $1_{2B}$, $1_{3B}$ may be affected by the voltages at the source line SL1 and at the corresponding bit line BL0, BL1, BL2, BL3.

Figure 2:
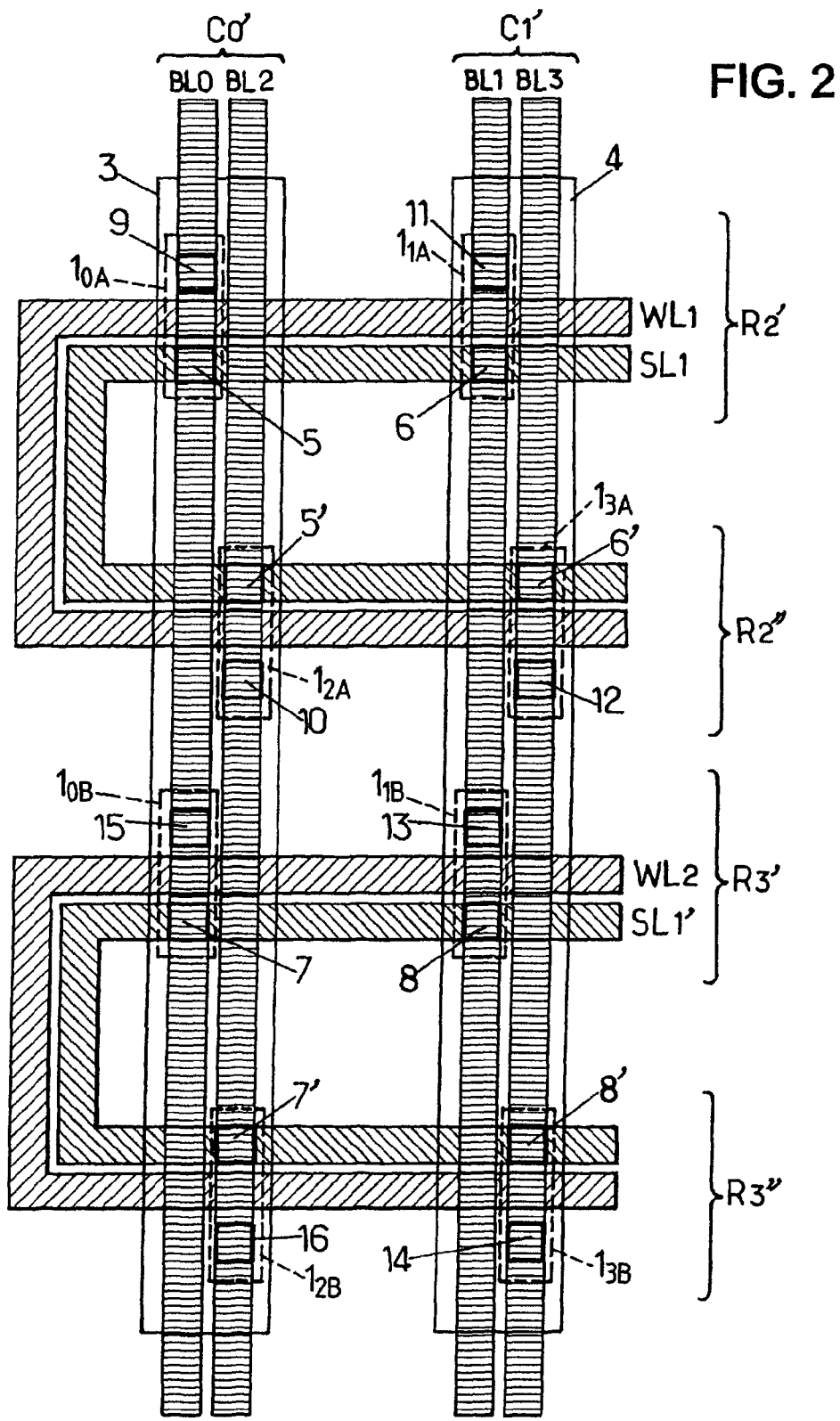
FIG. 2 shows a layout of an exemplary portion of a semiconductor array according to an embodiment.

FIG. 2 shows an example of a semiconductor array according to an embodiment.

In this embodiment, the array is a memory array. In an alternative embodiment (not represented), the semiconductor array may be a PLA.

The memory array comprises a matrix of cells $1_{0A}$, $1_{0B}$, $1_{1A}$, $1_{1B}$, $1_{2A}$, $1_{2B}$, $1_{3A}$, $1_{3B}$ and a plurality of control lines BL0, BL1, BL2, BL3, SL1, SL1', WL1, WL2.

Each cell comprises a number of elements depending on the kind of memory array. For example, the memory array may be a 1T DRAM, and each cell may comprise a single transistor.

Each cell $1_{0A}$, $1_{0B}$, $1_{1A}$, $1_{1B}$, $1_{2A}$, $1_{2B}$, $1_{3A}$, $1_{3B}$ may be selected by means of corresponding selection lines BL0, BL1, BL2, BL3, SL1, SL1', and may be written or read by means of a corresponding access line WL1, WL2.

Selection lines comprise bit lines BL0, BL1, BL2, BL3 coupled to drain terminals traces 9, 15, 11, 13, 10, 16, 12, 14, of the corresponding cells $1_{0A}$, $1_{0B}$, $1_{1A}$, $1_{1B}$, $1_{2A}$, $1_{2B}$, $1_{3A}$, $1_{3B}$ and source lines coupled to source terminals traces 5, 7, 6, 8, 5', 7', 6', 8' of the corresponding cells $1_{0A}$, $1_{0B}$, $1_{1A}$, $1_{1B}$, $1_{2A}$, $1_{2B}$, $1_{3A}$, $1_{3B}$.

Access lines comprise word lines WL1, WL2 coupled to gate terminals of the corresponding cells $1_{0A}$, $1_{0B}$, $1_{1A}$, $1_{1B}$, $1_{2A}$, $1_{2B}$, $1_{3A}$, $1_{3B}$.

Each bit line BL0, BL1, BL2, BL3 is coupled to cells of a single column C0', C1', each column being delimited by an active area 3, 4.

Each source line SL1, SL1', is coupled to cells of a plurality of columns C0', C1' and of two rows R2', R2", R3', R3". Each word line WL1, WL2 is coupled to cells of a plurality of columns C0', C1' and of two rows R2', R2", R3', R3". That is, each source line SL1, SL1' is coupled to cells of an n×m block of cells, n being both greater or equal to two and m being also greater or equal to two. Each word line WL1, WL2 is coupled to the cells of the n×m block of cells.

In this example, each word is four cells long, that is each source line and each word line extends over two columns C0', C1'. That is, n=2 and m=2.

For a 32 cells long word, as long as the source lines and the word lines also extend over two rows, each source line and each word line would extend over 16 columns.

To each column C0', C1' corresponds two bit lines BL0, BL1, BL2, BL3. One may note that the source lines and the word lines may extend over more than two rows. However, in this latter case, more than two bit lines have to be formed per column.

Each cell is coupled to a word line, a source line and a bit line, like in Prior Art.

The source lines and word lines are arranged so as to allow a better electrical control than in the prior art.

The resistance R of a wire may be expressed as:

$$R = \rho \frac{L}{A}$$

Wherein

ρ is the resistivity of the material of the wire,

L is the length of the path crossed by the electrons, and A is the area of a section of the wire, e.g., A varies with the width of the control line in our example.

In the embodiment illustrated in FIG. 2, the length of the path crossed by the electrons is indeed substantially two times shorter than in Prior Art. The resistance encountered is thus substantially two times shorter, which allows a better electrical control than in Prior Art.

Figure 3:
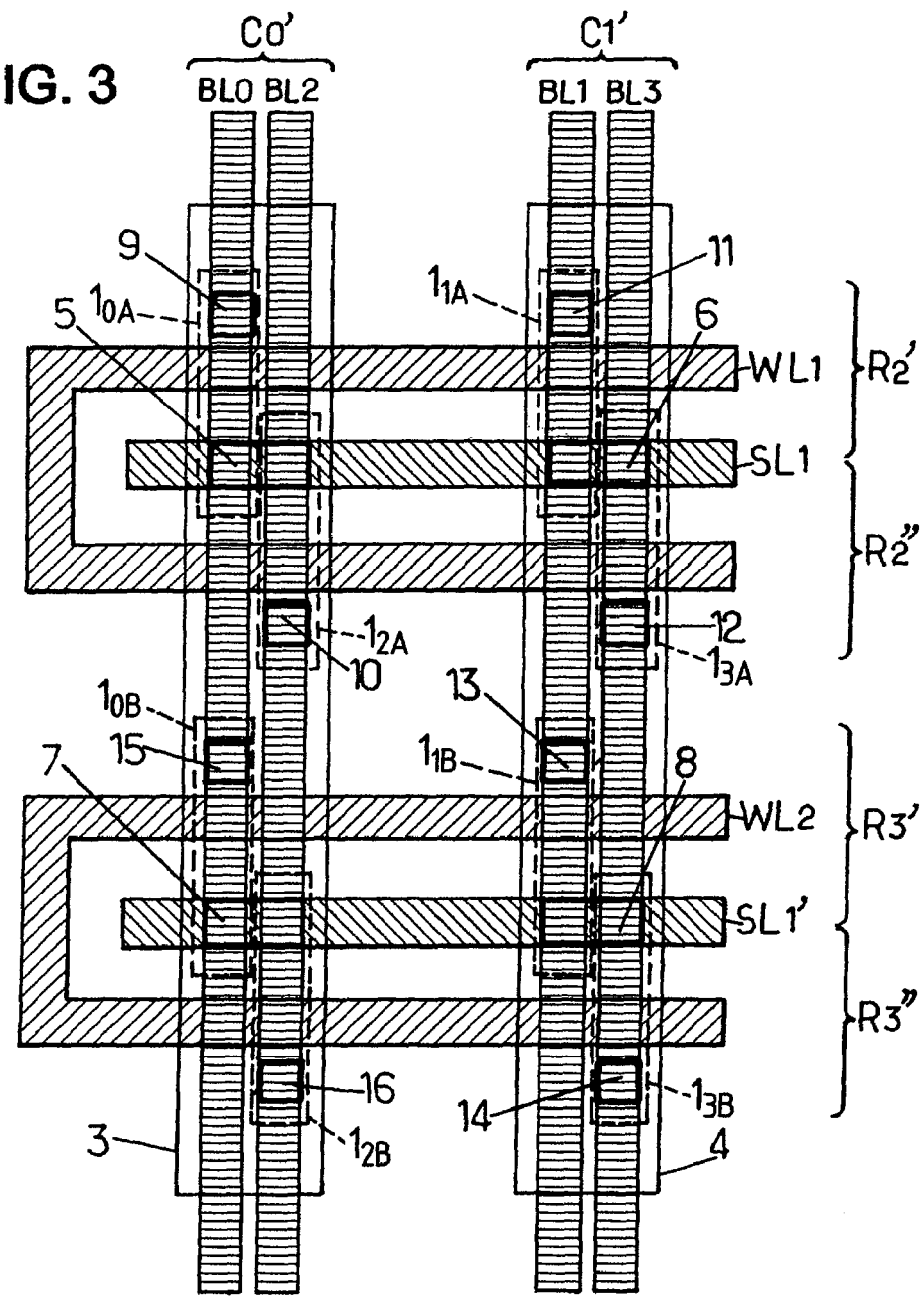
FIG. 3 shows a layout of an exemplary portion of a semiconductor array according to an embodiment.

In the embodiment illustrated in FIG. 3, the source lines and the word lines are arranged to as to provide an even smaller resistance.

Like in FIG. 2, the source lines SL1, SL1' and word lines WL1, WL2 are coupled with cells of two columns C0', C1', and two rows R2', R2'', R2', R3''. Furthermore, each cell $1_{0A}$, $1_{1A}$, $1_{0B}$, $1_{1B}$ of the two rows shares one of its terminals with a distinct cell in another one of the two rows and in the same column. For example, a same source terminal trace 5 is used as source terminal for both cells $1_{0A}$ and $1_{2A}$. Similarly, a same source terminal trace 6, 7, 8 is used as source terminal respectively for the pairs of cells $1_{1A}$ and $1_{3A}$, $1_{0B}$ and $1_{2B}$, $1_{1B}$ and $1_{3B}$.

Such a terminal share allows saving area. Also, the shape of the source lines SL1, SL1' may be relatively simple, as shown in FIG. 3. The resistance of the source line is hence relatively small, thus allowing a better electrical control.

The cells that share a same terminal may be relatively close to each other, that is the word lines WL1, WL2 may also be relatively short. The resistance of the word lines WL1, WL2 may hence be relatively small.

In this embodiment, the cells are floating body cells. The cells may for example be realized in a SOI technology.

One may subsequently expect that the cells sharing a same terminal with the cells that are read/written be disturbed by the reading/writing operation. For example, the cell $1_{2A}$ may have its gate voltage lowered by a few percents upon a reading/writing of the cell $1_{0A}$. However, the cells $1_{0A}$ and $1_{2A}$ belong to same word, e.g., the cell $1_{2A}$ is also attended to be read/written. The disturbing hence causes only little damage.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A semiconductor array, comprising:
   a matrix of cells, the matrix being arranged in rows and columns of cells; and
   a plurality of control lines, each cell being coupled to a number of said control lines to allow select and read/write said cell;
   wherein at least one of said control lines is coupled to cells of a plurality of columns and of at least two rows of the matrix;
   wherein at least one cell of said at least two rows shares one of its terminals with a distinct cell in another one of said at least two rows and in a same column, wherein the shared terminal is a single terminal on a trace without an insulating region between connections of the cells sharing the terminal to the shared terminal;
   wherein the number of said control lines to which is coupled each cell includes at least one selection line adapted to select said cell, and at least one access line adapted to read/write said cell; and
   wherein two distinct selection lines are respectively coupled to the at least one cell and to the distinct cell that share said shared terminal.

2. The semiconductor array of claim 1 wherein the array includes a memory array.

3. The semiconductor array of any one of claim 1 wherein the cells include floating body cells.

4. The semiconductor array of claim 1 wherein said array is realized in a silicon on insulator (SOI) technology.

5. The semiconductor array of claim 1 wherein said array is realized in a silicon on nothing (SON) technology.

6. A method for manufacturing a semiconductor array having a matrix of cells, the matrix being arranged in rows and columns of said cells, the method comprising:
   providing a plurality of control lines such that each cell is coupled to a number of said control lines; and
   enabling selecting and reading/writing said each cell wherein at least one of said control lines is coupled to cells of a plurality of columns and of at least two rows of the matrix;
   wherein at least one cell of said at least two rows shares one of its terminals with a distinct cell in another one of said at least two rows and in a same column, wherein the shared terminal is a single terminal on a trace without an insulating region between connections of the cells sharing the terminal to the shared terminal;
   wherein the number of said control lines to which is coupled each cell includes at least one selection line adapted to select said cell, and at least one access line adapted to read/write said cell; and
   wherein two distinct selection lines are respectively coupled to the at least one cell and to the distinct cell that share said shared terminal.

7. The method of claim 6 wherein said two distinct selection lines include bit lines.

8. The method of claim 6 wherein said shared one terminal includes a source terminal.

9. An apparatus, comprising:
   a matrix of memory cells arranged in rows and columns of said memory cells; and
   a plurality of control lines, each cell being coupled to a number of said control lines that includes at least one selection line adapted to select said cell, and at least one access line adapted to read/write said cell;

wherein at least one of said control lines is coupled to an n×m block of memory cells of said matrix, n being a number of columns greater than or equal to two, m being a number of rows greater than or equal to two;

wherein at least one cell of said n×m block shares one of its terminals with a distinct cell of said n×m block, said at least one cell and said distinct cell being in a same column, wherein the shared terminal is a single terminal on a trace without an insulating region between connections of the cells sharing the terminal to the shared terminal; and wherein said control lines include two distinct selection lines that are respectively coupled to the at least one cell and to the distinct cell that share said shared terminal.

10. The apparatus of claim 9 wherein said two distinct selection lines include bit lines.

11. The apparatus of claim 9 wherein said shared one terminal includes a source terminal.

12. The apparatus of claim 9 wherein:
said access line is coupled to all said memory cells of said block that extend over at least two rows of said block and over at least two columns of said block; and
at least one selection line is coupled to said memory cells of said block that extend over said at least two rows of said block and over said at least two columns of said block.

13. The apparatus of claim 9 wherein said matrix of memory cells includes at least one of floating body cells, silicon on insulator (SOI) cells, silicon on nothing (SON) cells, or complementary metal oxide semiconductor (CMOS) cells.

14. An apparatus, comprising:
a matrix of memory cells arranged in rows and columns of said memory cells;
a first control line coupled to an n×m block of memory cells of said matrix, n being a number of columns greater than or equal to two, m being a number of rows greater than or equal to two, said first control line being coupled to read/write terminals of all memory cells of said block that extend over at least two rows of said block and over at least two columns of said block;
a second control line coupled to selection terminals of said memory cells of said block that extend over said at least two rows of said block and over said at least two columns of said block; and
two distinct selection lines respectively coupled to at least one cell of said n×m block and to a distinct cell of said n×m block, said at least one cell and said distinct cell having shared selection terminals, wherein a length of said first control line or of said second control line is selected to reduce a number of cells in each row for a word, so as to decrease an electron travel distance and to reduce resistance.

15. The apparatus of claim 14 wherein said distinct selection lines include bit lines.

16. The apparatus of claim 14 wherein the two distinct selection lines are bit selection lines and the each cell in adjacent rows coupled to a same first control line are coupled to different bit selection lines.

17. The semiconductor array of claim 1 wherein a length of at least one of said plurality of control lines is selected to reduce a number of cells in each row for a word, so as to decrease an electron travel distance and to reduce resistance.

18. The seminconductor array of claim 1 wherein the two distinct selection lines are bit selection lines and cells in adjacent rows coupled to a same access control line are coupled to different bit selection lines.

19. The method of claim 6 wherein a length of at least one of said plurality of control lines is selected to reduce a number of cells in each row for a word, so as to decrease an electron travel distance and to reduce resistance.

20. The method of claim 6 wherein the two distinct selection lines are bit selection lines and cells in adjacent rows coupled to a same access control line are coupled to different bit selection lines.

21. The apparatus of claim 9 wherein a length of at least one of said plurality of control lines is selected to reduce a number of cells in each row for a word, so as to decrease an electron travel distance and to reduce resistance.

22. The apparatus of claim 9 wherein the two distinct selection lines are bit selection lines and cells in adjacent rows coupled to a same access control line are coupled to different bit selection lines.

23. A seminconductor array, comprising:
a matrix of cells arranged in rows and columns;
a plurality of control line traces of a first type, each control line trace of the first type coupled to cells in at least two rows and at least two columns of the matrix and forming respective partially enclosed areas;
a plurality of control line traces of a second type, each control line trace of the second type being coupled to cells coupled to a respective control line trace of the first type within the respective partially enclosed area formed by the respective control line trace of the first type; and
a plurality of control line traces of a third type each coupled to:
at least one cell coupled to a first control line trace of the first type and a first control line trace of the second type; and
at least one cell coupled to a second control line trace of the first type and a second control line trace of the second type.

24. The semiconductor array of claim 23, wherein each control line trace of the second type has at least one terminal coupling the control line trace of the second type to two cells of the matrix.

25. The semiconductor array of claim 23 wherein the control line traces of the first type are access control lines, the control line traces of the second type are selection control lines, and the control line traces of the third type are bit selection lines.

* * * * *